United States Patent [19]

Garg et al.

[11] Patent Number: 5,262,202
[45] Date of Patent: * Nov. 16, 1993

[54] HEAT TREATED CHEMICALLY VAPOR DEPOSITED PRODUCTS AND TREATMENT METHOD

[75] Inventors: Diwakar Garg, Macungie; Paul N. Dyer, Allentown, both of Pa.; Duane Dimos, Upper Mount Clair, N.J.

[73] Assignee: Air Products and Chemicals, Inc., Allentown, Pa.

[*] Notice: The portion of the term of this patent subsequent to Feb. 20, 2007 has been disclaimed.

[21] Appl. No.: 370,412

[22] Filed: Jun. 20, 1989

Related U.S. Application Data

[62] Division of Ser. No. 157,550, Feb. 17, 1988, Pat. No. 4,873,152.

[51] Int. Cl.$^5$ ............................................. C23C 16/00
[52] U.S. Cl. .......................... 427/383.3; 427/383.1; 427/383.5; 427/383.7; 427/249
[58] Field of Search ................ 427/383.7, 383.3, 383.5, 427/383.1, 249

[56] References Cited

U.S. PATENT DOCUMENTS

| | | | |
|---|---|---|---|
| 2,872,350 | 2/1959 | Homer | 427/249 |
| 3,574,672 | 4/1971 | Tarver | 427/249 |
| 3,721,577 | 3/1973 | Woerner | 427/249 |
| 3,814,625 | 6/1974 | Lewin | 427/249 |
| 4,147,820 | 4/1979 | Holzl | 427/249 |
| 4,162,345 | 7/1979 | Holzl | 427/249 |
| 4,761,346 | 8/1988 | Naik . | |
| 4,855,188 | 8/1989 | Garg | 428/665 |
| 4,873,152 | 10/1989 | Garg | 428/665 |
| 4,874,642 | 10/1989 | Garg | 427/249 |
| 4,902,535 | 2/1990 | Garg | 427/249 |

FOREIGN PATENT DOCUMENTS

| | | | |
|---|---|---|---|
| 690007 | 7/1964 | Canada | 427/249 |
| 21409 | 2/1979 | Japan | 427/249 |
| 104088 | 8/1979 | Japan | 427/249 |
| 2771 | 1/1980 | Japan | 427/249 |
| 1084375 | 4/1986 | Japan | 427/249 |
| 1157681 | 7/1986 | Japan | 427/249 |
| 2205275 | 9/1987 | Japan | 427/249 |
| 2290871 | 12/1987 | Japan | 427/249 |

OTHER PUBLICATIONS

R. Travieso "Tungsten Carbide Print Wire Fabrication" IBM Technical Disclosure Bulletin vol. 20, No. 7 Dec. 1977 p. 2527.
"Erosion of Conventional and Ultrafine-Grained Materials", by G. Hickey et al, Thin Solid Films 118, pp. 321-333, 1984.
"Microstructural Evaluation of CM500L, A New W-C Alloy Coating Deposited by the Controlled Nucleation Thermochemical Deposition Process", by D. G. Bnat & R. A. Holzl, Thin Solid Films, 95, pp. 105-112, 1982.

Primary Examiner—Terry J. Owens
Assistant Examiner—Vi Duong Dang
Attorney, Agent, or Firm—Keith D. Gourley; James C. Simmons; William F. Marsh

[57] ABSTRACT

A method for heat treating a coated substrate is described wherein the outer coating on the substrate is comprised of a chemically vapor deposited mixture of tungsten and tungsten carbide. The coated substrate is heated to the deposition temperature or not substantially above the deposition temperature in a non-reactive atmosphere. The heat treating temperature is sufficient to confer a desired improvement in erosive and abrasive wear resistance in the outer coating but does not result in substantial degradation of the mechanical properties of the substrate or in formation of undesirable inter-metallic layers.

16 Claims, 2 Drawing Sheets

AM-350
STAINLESS
STEEL

Ti/6Al/4V

HEAT TREATED CHEMICALLY VAPOR DEPOSITED PRODUCTS AND TREATMENT METHOD

This is a division of application Ser. No. 07/157,550, filed Feb. 17, 1988, now U.S. Pat. No. 4,873,152, issued Oct. 10, 1989.

FIELD OF THE INVENTION

This invention relates to high hardness fine grained chemically vapor deposited highly erosive and abrasive wear resistant products and, more particularly, to an improved heat treatment for such products.

BACKGROUND OF THE INVENTION

High hardness materials are widely used as coatings on various types of mechanical components and cutting tools. Such coatings impart erosive and abrasive wear resistance and thus increase the erosive and abrasive wear life of the objects that have been coated. High hardness materials can also be used to produce free standing objects which are erosive and abrasive wear resistant.

Chemical vapor deposition processes can be used to produce highly erosive and abrasive wear resistant hard coatings and free standing objects. In a typical chemical vapor deposition (CVD) process, the substrate to be coated is heated in a suitable chamber and then a gaseous reactant mixture is introduced to the chamber. The gaseous reactant mixture reacts at the surface of the substrate to form a coherent and adherent layer of the desired coating. By varying the gaseous reactant mixture and other CVD process parameters, various types of deposit coatings can be produced.

In copending U.S. application Ser. No. 92,809 filed Sep. 3, 1987, now U.S. Pat. No. 4,874,642 extremely hard, fine grained, non-columnar, substantially lamellar tungsten/carbon alloys are described which are produced by chemical vapor deposition. The described alloys consist primarily of a mixture of a substantially pure tungsten phase and at least one carbide phase wherein the carbide phase consists of $W_2C$ or $W_3C$ or a mixture of $W_2C$ and $W_3C$. The disclosed tungsten/carbon alloys are free of columnar grains and consist essentially of extremely fine, equiaxial crystals. The deposits are produced at temperatures in the range of 300° to 650° C. At such low temperatures, degradation of the mechanical properties of the substrate is minimized as are problems resulting from wide differences between thermal coefficients of expansion in the substrate and the coating materials.

It has been found that the tungsten/carbon alloys such as those described in the aforementioned U.S. Patent Application, when deposited upon certain types of substrates, exhibit a very fine microcrack system throughout the deposit. On many types of substrates and under many types of erosive and abrasive wear conditions, preferential attack occurs at the cracks, resulting in reduced erosion and abrasion wear resistance of such coatings.

In co-pending U.S. patent application Ser. No. 07/153,738, filed Feb. 8, 1988 now U.S. Pat. No. 4,855,188, issued Aug. 8, 1989 now U.S. Pat. No. 4,855,188 a highly erosive and abrasive wear resistant composite coating system is described in which an intermediate layer of substantially pure tungsten is deposited prior to depositing tungsten/carbon alloy coating. The outer tungsten/carbon alloy layer is comprised of a mixture of tungsten and tungsten carbide, with the tungsten carbide phase comprising of $W_2C$, $W_3C$ or a mixture of both. The thickness of the intermediate tungsten layer is controlled in a manner to reduce or eliminate micro-cracks in the composite coating system and confer substantial erosive and abrasive wear characteristics on the composite coating system. The ratio of the thickness of the inner tungsten layer to the thickness of the outer tungsten/carbon alloy layer is at least above 0.3 in the cases of $W+W_3C$, $W+W_2C+W_3C$ and $W+W_2C$ coatings. Additionally, the ratio of the thickness of the inner layer to the thickness of the outer layer to get optimum erosion and abrasion wear performance is at least 0.35 in the case of mixtures of tungsten and $W_2C$ in the outer layer, 0.60 in the case of mixtures of tungsten and $W_3C$ in the outer layer and, 0.35 in the case of mixtures of tungsten and $W_2C$ and $W_3C$ in the outer layer.

The heat treating of various materials to improve properties is well known. A pertinent example of such heat treatment is described in detail in a paper by G. Hickey, et al "Erosion of Conventional and Ultrafine-Grained Materials," Thin Solid Films, 118, pp. 321-333, 1984. In this article, the thermochemical deposition of a mixture of W-WC is described. This deposit, which is heavily microcracked, may be heat treated at a temperature of between 550 and 6000C. The coating is said to undergo a phase change at this temperature and results in a five fold increase in erosion resistance. See also D. G. Bhat and R. A. Holzl, "Microstructural Evaluation of CM 500L, A New W-C Alloy Coating Deposited by the Controlled Nucleation Thermochemical Deposition Process," Thin Solid Films, 95, pp. 105-112, 1982. Unfortunately, a phase change and presence of microcracks in some coatings may be undesirable. Moreover heat treatment at such temperatures may seriously degrade the mechanical properties of the substrate and may also result in the formation of undesirable brittle inter-metallic compounds at the boundary layer between the substrate and the protective interlayer.

The use of heat treatment below 550° C. to enhance the microstructure and erosive and abrasive wear resistance properties of the coating without degrading the mechanical properties of the substrate is neither discussed nor presented in the prior art.

BRIEF DESCRIPTION OF THE FIGURES

FIG. 2A is a photomicrograph, magnified 2000 times, of an etched cross section of a coating system according to the invention on AM-350 stainless steel substrate heat treated in-situ for 60 minutes showing the absence of non-uniformity in the microstructure.

FIG. 2B is a photomicrograph, magnified 2000 times, of an etched cross section of a coating system according to the invention on Ti/6Al/4V substrate heat treated in-situ for 60 minutes showing the absence of non-uniformity in the microstructure.

FIG. 3A is a photomicrograph, magnified 2000 times, of an etched cross section of a coating system according to the invention on AM-350 stainless steel substrate heat treated in-situ for 120 minutes showing the absence of non-uniformity in the microstructure.

FIG. 3B is a photomicrograph, magnified 2000 times, of an etched cross section of a coating system according to the invention on Ti/6Al/4V substrate heat treated in-situ for 120 minutes showing the absence of non-uniformity in the microstructure.

FIG. 4A is a photomicrograph, magnified 2000 times, of an etched cross section of a coating system according to the invention on AM-350 stainless steel substrate heat treated externally for 60 minutes showing significantly reduced non-uniformity in the microstructure.

FIG. 4B is a photomicrograph, magnified 2000 times, of an etched cross section of a coating system according to the invention on Ti/6Al/4V substrate heat treated externally for 60 minutes showing significantly reduced non-uniformity in the microstructure.

FIG. 5A is a photomicrograph, magnified 2000 times, of an etched cross section of a coating system according to the invention on AM-350 stainless steel substrate heat treated externally for 1440 minutes showing the absence of non-uniformity in the microstructure.

FIG. 5B is a photomicrograph, magnified 2000 times of an etched cross section of a coating system according to the invention on Ti/6Al/4V substrate heat treated externally for 1440 minutes showing the absence of non-uniformity in the microstructure.

FIG. 6A is a photomicrograph, magnified 2000 times, of an etched cross section of a coating system according to the invention on AM-350 stainless steel substrate heat treated in-situ for 60 minutes followed by external heat treatment for 720 minutes at 500°C showing the absence of non-uniformity in the microstructure.

FIG. 6B is a photomicrograph, magnified 2000 times, of an etched cross section of a coating system according to the invention on Ti/6Al/4V substrate heat treated in-situ for 60 minutes followed by external heat treatment for 720 minutes at 500° C. showing the absence of non-uniformity in the microstructure.

FIG. 6C is a photomicrograph, magnified 1000 times, of a coating on AM-350 stainless steel substrate heat treated in-situ for 60 mintues followed by external heat treatment for 720 minutes at 500° C. showing cracks in the coating.

FIG. 6D is a photomicrograph, magnified 1000 times, of a coating on Ti/6Al/4V substrate heat treated in-situ for 60 minutes followed by external heat treatment for 720 minutes at 500° C. showing cracks in the coating.

FIG. 7A is a photomicrograph, magnified 2000 times, of an etched cross section of a coating system according to the invention on AM-350 stainless steel substrate heat treated in-situ for 60 minutes followed by external heat treatment for 720 minutes at 550° C. showing the absence of non-uniformity in the microstructure.

FIG. 7B is a photomicrograph, magnified 2000 times, of an etched cross section of a coating system according to the invention on Ti/6Al/4V substrate heat treated in-situ for 60 minutes followed by external heat treatment for 720 minutes at 550° C. showing the absence of non-uniformity in the microstructure and the formation of an intermetallic titanium-nickel compound.

FIG. 8A is a photomicrograph, magnified 1000 times, of a coating on AM-350 stainless steel substrate heat treated in-situ for 60 minutes followed by external heat treatment for 720 minutes at 600° C. showing cracks in the coating.

FIG. 8B is a photomicrograph, magnified 1000 times, of a coating on Ti/6Al/4V substrate heat treated in-situ for 60 minutes followed by external heat treatment for 720 minutes at 600° C. showing cracks in the coating.

FIG. 8C is a photomicrograph, magnified 2000 times, of an etched cross section of a coating system according to the invention on AM-350 stainless steel substrate heat treated in-situ for 60 minutes followed by external heat treatment for 720 minutes at 600°C showing the absence of non-uniformity in the microstructure.

FIG. 8D is a photomicrograph, magnified 2000 times, of an etched cross section of a coating system according to the invention on Ti/6Al/4V substrate heat treated in-situ for 60 minutes followed by external heat treatment for 720 minutes at 600° C. showing the absence of non-uniformity in the microstructure and the formation of an intermetallic titanium-nickel compound.

FIG. 9 is a photomicrograph, magnified 500 times, of a cross section of a coating system on Ti/6Al/4V substrate heat treated in-situ for 60 minutes followed by external heat treatment for 720 minutes at 600° C. showing the failure of the coating during the erosion test.

SUMMARY OF THE INVENTION

Figure 1A:
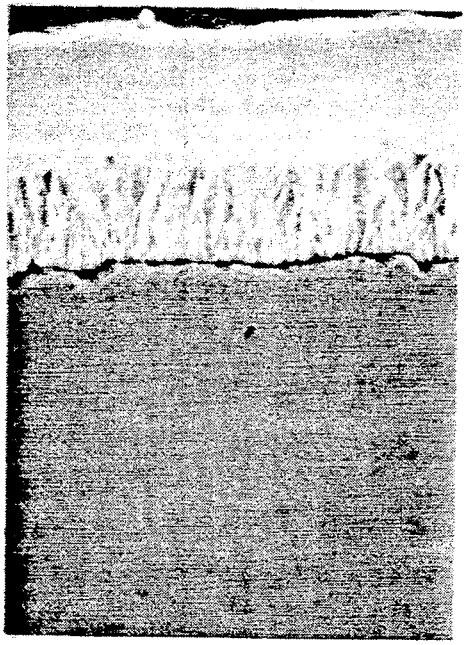
FIG. 1A is a photomicrograph, magnified 2000 times, of an etched cross section of a coating system according to the invention on AM-350 stainless steel substrate in the as-deposited and unheat-treated condition showing non-uniform microstructure in the top one-fourth thickness of the tungsten/tungsten carbide layer.

In accordance with the present invention, a coated substrate wherein the outer coating is comprised of a chemically vapor deposited tungsten/carbon alloy is subjected to a specific heat treatment. The heat treatment comprises heating the coated substrate to a temperature in the range from about the deposition temperature to a temperature not substantially above the deposition temperature in a non-reactive atmosphere. The heat treatment temperature is sufficient to confer a desired improvement in erosion and abrasion wear resistance in the outer coating but is low enough to avoid resulting in substantial degradation of the mechanical properties of the substrate or in formation of undesirable inter-metallic layers. The resultant product has an outer coating comprising a fine grained, non-columnar, substantially lamellar and uniform microstructure which is substantially free of cracks. The coating has a substantially higher erosion and abrasion wear resistance than in the unheat-treated condition.

DETAILED DESCRIPTION OF THE INVENTION

In order to produce a hard, fine grained, non-columnar alloy of tungsten and carbon on a substrate, a particular process is used to result in a deposit consisting essentially of a mixture of a substantially pure tungsten phase and a tungsten carbide phase, with the tungsten carbide phase comprising of $W_2C$, $W_3C$ or a mixture of both. These tungsten-carbon alloys or coatings are defined herein as tungsten/tungsten carbide to simplify the description. In order to accomplish this, a chemical vapor deposition reactor is employed and a mixture of process gases is introduced to the reactor. The tungsten/ tungsten carbide coating is deposited under subatmospheric to slightly atmospheric pressure, i.e., within the range of about 1 Torr. to about 1,000 Torr., at a temperature of about 300° to about 650° C. This layer may be either a two phase layer comprising tungsten and $W_2C$ or tungsten and $W_3C$. Alternatively, this layer may be a three phase layer comprising tungsten, $W_2C$, and $W_3C$. The relative proportions of the tungsten, $W_2C$, and $W_3C$ in the tungsten/tungsten carbide coating may be selected in accordance with the particular properties desired in the final coating system. In order to achieve such proportions, the tungsten/tungsten carbide coating is applied utilizing a flow of tungsten halide such as $WF_6$, an inert gas such as argon, hydrogen and an oxygen containing hydrocarbon such as dimethylether (DME). By controlling the temperature, W/C atomic ratio in the feed gas and the ratio of hydrogen to $WF_6$ during the deposition reaction, the particular desired chemical composition of the tungsten/tungsten carbide layer may be obtained. Details of the foregoing described process may be found in applicants' co-pending U.S. patent application Ser. No. 92,809 filed Sep. 3, 1987, now U.S. Pat. No. 4,874,642.

In order to provide good erosive and abrasive wear properties and at the same time reduce or eliminate cracking in the deposited outer layer, an intermediate layer of tungsten is employed. The intermediate layer of tungsten is produced by chemical vapor deposition under sub-atmospheric to slightly atmospheric pressure, i.e., within the range of about 1 Torr. to about 1,000 Torr., at a temperature of about 300° to about 650° C., using a mixture of tungsten halide such as $WF_6$ an inert gas such as argon, and hydrogen. The intermediate layer of tungsten is of sufficient thickness to reduce or eliminate micro-cracks in the overall coating and to confer substantial erosive and abrasive wear resistant characteristics to the overall coating system. Details of the selection of the thicknesses of the inner tungsten layer and outer tungsten/tungsten carbide layer may be found in applicants' co-pending U.S. patent application Ser. No. 07/153758 filed Feb. 8, 1988.

The present coating system of the invention can be deposited on a number of ferrous metals and alloys such as cast irons, carbon steels, stainless steels and high speed steels, non-ferrous metals and alloys such as copper, nickel, platinum, rhodium, titanium, aluminum, silver, gold, niobium, molybdenum, cobalt, tungsten, rhenium, copper alloys and nickel alloys such as inconel and monel, titanium alloys such as Ti/Al/V, Ti/Al/Sn, Ti/Al/Mo/V, Ti/Al/Sn/Zr/Mo, Ti/Al/V/Cr, Ti/Mo/V/Fe/Al, Ti/Al/V/Cr/Mo/Zr and Ti/Al/V/Sn alloys, and the like, non-metals such as graphite, carbides such as cemented carbide and ceramics such as silicon carbide, silicon nitride, alumina, and the like. In depositing the present coating system on reactive substrate materials, such as cast irons, carbon steels, stainless steels, high speed steels, and nickel and monel alloys, it is preferred to coat the substrate first with a more noble material such as nickel, cobalt, copper, silver, gold, platinum, palladium or iridium, by electrochemical or electroless techniques or by a physical vapor deposition technique such as sputtering.

In depositing the present coating system on reactive titanium or titanium alloys, it is also preferred to coat the substrate first with a more noble material described above by an electroless technique or by physical vapor deposition technique such as sputtering. It is also preferred to coat the substrate first with a thin layer of a more noble material described above by electroless techniques followed by another thin layer of a more noble material by electrochemical or physical vapor deposition technique. It is also preferred to clean the surface of the titanium or titanium alloy substrate first and heat treat the noble metal deposit after depositing on the substrate. The deposition of noble metal and subsequent heat treatment steps on titanium or titanium alloys are described in detail in co-pending U.S. patent application Ser. No. 139,891, filed Dec. 31, 1987 now U.S. Pat. No. 4,402,535. It is also preferred that the upper limit of the chemical vapor deposition temperature be about 525° C. when depositing the present coating system on titanium or titanium alloys to minimize the degradation of the mechanical properties. No deposition of the noble material, however, is required for coating non-reactive materials such as copper, nickel, cobalt, silver, gold, platinum, rhodium, niobium, molybdenum, tungsten, rhenium, graphite, carbides and ceramics. Free standing parts of the coating of the present invention can be made by depositing it on the substrates such as copper, nickel, cobalt, silver, gold, molybdenum, rhenium, and graphite and then removing these substrates by grinding and chemical or electrochemical etching.

The outer layer of tungsten/tungsten carbide has a fine grained, substantially layered microstructure which, in the as-deposited condition, contains substantial non-unifomity in the outermost 25% of the thickness of the layer. This non-unifomity is undesirable, since it produces areas of uneven erosion and abrasion wear resistance qualities. However, because the deposition is carried out at relatively low temperatures, mechanical degradation of the properties of the substrate is minimized while at the same time cracking of the deposit is reduced or eliminated due to differences in coefficient of thermal expansion between the deposit and the substrate.

In accordance with the invention, the coated substrate is heat treated by subjecting it to a heat treatment temperature which is specifically selected dependent upon the materials employed. The heat treatment significantly reduces the non-uniformity in the outer layer and increases the erosion and abrasion wear resistance of the deposit. The heat treatment temperature is selected to be at or close to the deposition temperature but should not substantially exceed the deposition temperatures. Thus, if the deposition temperature is in excess of 500° C., for example 525° C., the heat treatment temperature should not be substantially above 525° C. By maintaining this temperature, several advantages accrue. First of all, degradation in the mechanical properties of the substrate is minimized, since the heat treatment temperature is too low to result in significant changes in tensile strength or bend strength. Secondly, the formation of undesirable inter-metallic layers, due to, for example, diffusion of materials across the protective interlayer boundaries is minimized. Finally, the heat treatment temperature is low enough to reduce or eliminate stress microcracking of the coating due to differences in the thermal coefficient of expansion between the coating and the substrate.

The heat treatment takes place in a non-reactive atmosphere, preferably one which comprises hydrogen, argon, helium, nitrogen, or a mixture of two or more of said gases or under vacuum. The time of heat treatment is selected to be sufficient to confer a desired improvement in erosion and abrasion wear resistance in the outer coating. Thus, at least up to a reasonable length of time, the longer the heat treatment, the greater improvement results. However, design and cost of manufacture tradeoffs will determine the specific time of heat treatment used depending upon the use to which the product is to ultimately put. Although no maximum limit on heat treatment time has, as yet, been determined, it is believed that extreme heat treatment times may result in degradation of the mechanical properties of the substrate or in the formation of undesirable and brittle inter-metallic layers. It has been found that a preferred minimum heat treatment time is one hour.

The resultant product includes an outer layer of a tungsten/tungsten carbide which has a substantially layered and uniform microstructure substantially free of cracks. By viewing FIG. 1A, the substantially layered microstructure of the deposit before heat treatment may be observed. It will also be noted that, although the deposit is substantially free of cracks, a somewhat non-uniform microstructure exists in the outer 25% of the tungsten/tungsten carbide layer. As may be seen in FIG. 2A, the heat treatment removes this non-uniformity. Moreover, the data set out below demonstrate that the outer layer furthermore has a substantially higher erosion and abrasion wear resistance than in the unheat-treated condition.

GENERAL INFORMATION

A number of specimens of AM-350 precipitated hardened stainless steel, which is a representative ferrous alloy, and Ti/6Al/4V, which is a typical non-ferrous, structural alloy, were used in the experiments embodied in the following examples. AM-350 stainless steel specimens were electroplated with a 2 to 5 μm thick protective nickel layer prior to coating to protect them from attack by hot and corrosive gases used during the CVD process. Ti/6Al/4V specimens were plated with a 2 to 5 μm thick protective nickel layer using an electroless deposition technique prior to coating.

EROSION TEST PROCEDURE

The erosion resistance performance of the uncoated and coated specimens was determined using a miniature sandblast unit; the test parameters are summarized in Table 1. The fine alumina powder, which was used as the erodent material, provided a very harsh erosion environment, as compared to sand erosion; consequently, an accelerated test procedure could be used. The erosion rate of the base metals was determined by measuring the depth of the pit produced during a two minute erosion test. The erosion resistance of the coated specimens was determined by measuring the time it took for the erodent material to penetrate the tungsten/tungsten carbide top coating; this time is called breakthrough time. Penetration of the tungsten/tungsten carbide coating was visibly apparent as a color change at the center of the erosion pit. The fact that this color change corresponded to the initial penetration of the coating was confirmed by microscopic examination of erosion pits in cross section. The erosion rate was then calculated as the time required to penetrate the tungsten/tungsten carbide coating on a per mil basis.

Example 1

Uncoated specimens of AM-350 stainless steel and Ti/6Al/4V were eroded with alumina for two minutes (120 seconds). The depth of the crater was measured to calculate the erosion rate. The calculated erosion rate was 60 and 50 seconds/mil for AM-350 and Ti/6Al/4V specimens, respectively.

TABLE 1

| Erosion Test Procedure | |
| --- | --- |
| Nozzle Diameter | 0.018 inch |
| Stand Off Distance | 0.6 inch |
| Erosion Media | Fine Alumina Powder (50 μm Average Particle Size) |
| Supply Pressure | 32 psig |
| Flow Rate of Erosion Media | 1.6 g/min. |
| Erosion Test Standard | Breakthrough Time |

Example 2

A number of AM-350 and Ti/6Al/4V specimens (0.040 inch×0.75 inch×2 inch) were placed in an inductively heated graphite furnace inside a gas-tight quartz envelope. The specimens were coated with a hard coating using a two step coating process. The specimens were heated to a temperature of about 460° C. and a gaseous mixture of 250 cc/min $WF_6$, 2,500 cc/min hydrogen and 6,000 cc/min argon was passed into the furnace over the specimens for 20 minutes to coat them with tungsten. After coating specimens with tungsten for 20 minutes, a gaseous mixture of 300 cc/min $WF_6$, 3,000 cc/min hydrogen, 2,400 cc/min argon and 90 cc/min dimethylether (DME) was passed into the furnace for 90 minutes to provide a hard tungsten/tungsten carbide top coating. The total pressure was maintained at 40 Torr during the tungsten as well as the tungsten/tungsten carbide coating steps (see Table 2). Immediately after coating the specimens for 90 minutes with tungsten/tungsten carbide, the flow of $WF_6$ and DME was discontinued. The power to the induction heater was also turned-off and the specimens were cooled. A total pressure of 40 Torr was maintained during cool down.

Figure 1B:
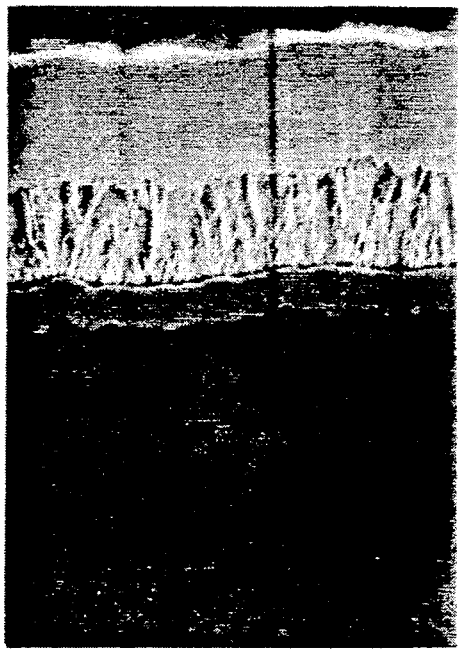
FIG. 1B is a photomicrograph, magnified 2000 times, of an etched cross section of a coating system according to the invention on Ti/6Al/4V substrate in the as-deposited and unheat-treated condition showing non-uniform microstructure in the top one-fourth thickness of the tungsten/tungsten carbide layer.
Figure 1C:
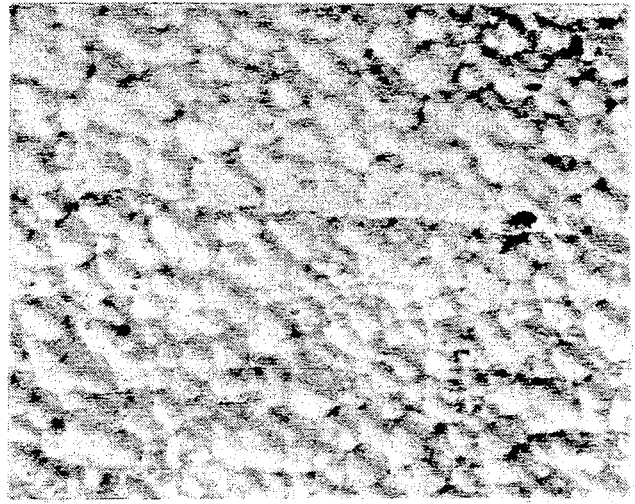
FIG. 1C is a photomicrograph, magnified 1000 times, of a coating on AM-350 stainless steel showing the absence of cracks in the coating.
Figure 1D:
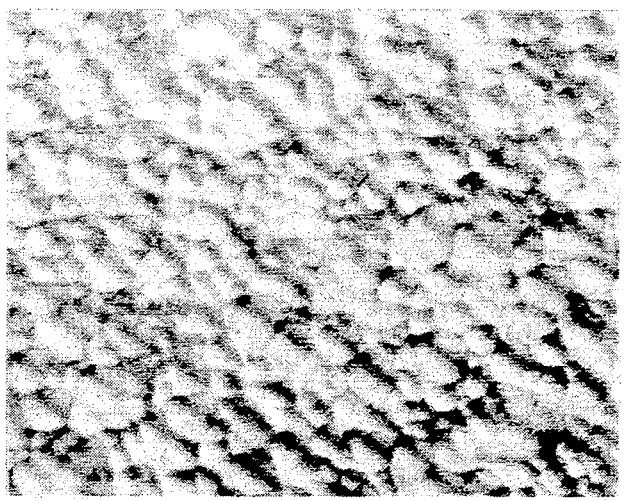
FIG. 1D is a photomicrograph, magnified 1000 times, of a coating on Ti/6Al/4V showing the absence of cracks in the coating.

The AM-350 and Ti/6Al/4V specimens were coated with ~10 μm thick tungsten followed by ~12 μm tungsten/tungsten carbide, as shown in Table 2. The tungsten interlayer had the well known columnar growth microstructure; whereas, the tungsten/tungsten carbide top coat had a fine-layered structure, as shown in FIGS. 1A and 1B. The top one fourth of the tungsten/tungsten carbide coating both on AM-350 stainless steel and Ti/6Al/4V showed a non-uniform microstructure after etching, which is done to reveal the coating microstructure. The tungsten/tungsten carbide coating had a surface finish of ~20 μ inch. Additionally, it was free of cracks, as shown in FIGS. 1C and 1D. X-ray diffraction analysis revealed that the tungsten/tungsten carbide top coat consisted of a mixture of W and $W_2C$ phases, as shown in Table 3. The erosion rate of the tungsten/tungsten carbide top coat on AM-350 stainless steel and Ti/6Al/4V was 279 and 282 seconds/mil, respectively (see Table 3). The erosion data presented in the Table 3 also showed the reproducibility of the erosion test procedure; the erosion resistance data varied by less than ±4% of the mean value. The erosion resistance of the coated specimens was approximately five timex better than the uncoated specimens. The hardness of tungsten/tungsten carbide top coat was approximately 2,300 Vickers, as shown in Table 3.

TABLE 2

|  | Example 2 | | Example 3 | | Example 4 | | Example 5 | |
| --- | --- | --- | --- | --- | --- | --- | --- | --- |
| Experiment No. | 209 | | 207 | | 203 | | 233 | |
| Substrate | AM-350 | Ti/6Al/4V | AM-350 | Ti/6Al/4V | AM-350 | Ti/6Al/4V | AM-350 | Ti/6Al/4V |
| Temperature, °C. | | 460 | | 460 | | 460 | | 460 |
| Pressure, torr | | 40 | | 40 | | 40 | | 40 |
| W Coating Conditions | | | | | | | | |
| $H_2$, SCCM | | 2,500 | | 2,500 | | 2,500 | | 2,500 |
| Ar, SCCM | | 6,000 | | 6,000 | | 6,000 | | 6,000 |
| $WF_6$, SCCM | | 250 | | 250 | | 250 | | 250 |
| Time, Min. | | 20 | | 20 | | 20 | | 20 |
| Tungsten/Tungsten Carbide Conditions | | | | | | | | |
| $H_2$, SCCM | | 3,000 | | 3,000 | | 3,000 | | 3,000 |
| Ar, SCCM | | 2,400 | | 2,400 | | 2,400 | | 2,400 |
| $WF_6$, SCCM | | 300 | | 300 | | 300 | | 300 |
| DME, SCCM | | 90 | | 90 | | 90 | | 90 |
| Time, Min. | | 90 | | 90 | | 90 | | 90 |
| Substrate | AM-350 | Ti/6Al/4V | AM-350 | Ti/6Al/4V | AM-350 | Ti/6Al/4V | AM-350 | Ti/6Al/4V |
| In-Situ Post Heat Treatment Time, Min. | | 0 | | 60 | | 120 | | 480 |
| Coating Thickness, μm | | | | | | | | |
| Tungsten | 10.1 | 9.9 | 11.7 | 11.3 | 10.5 | 10.5 | 8.5 | 8.1 |
| Tungsten/Tungsten Carbide | 12.0 | 12.0 | 13.2 | 13.2 | 13.3 | 13.3 | 10.5 | 10.5 |

TABLE 3

|  | Example 2 | | Example 3 | | Example 4 | | Example 5 | |
| --- | --- | --- | --- | --- | --- | --- | --- | --- |
| Experiment No. | 209 | | 207 | | 203 | | 233 | |
| Substrate | AM-350 | Ti/6Al/4V | AM-350 | Ti/6Al/4V | AM-350 | Ti/6Al/4V | AM-350 | Ti/6Al/4V |
| Tungsten/Tungsten Carbide Coating Composition | W + $W_2C$ | | W + $W_2C$ | | W + $W_2C$ | | W + $W_2C$ | |
| Tungsten/Tungsten Carbide Coating Hardness, Kg/mm² | 2291 ± 101 | 2281 ± 76 | 2395 | 2289 | 2317 | 2315 | 2191 | 2191 |
| Erosion Resistance | | | | | | | | |
| Breakthrough Time, Secs | 132 ± 2 | 133 ± 5 | 165 | 164 | 186 | 186 | 144 | 158 |
| Calculated Erosion Rate, secs/mil | 279 ± 5 | 282 ± 11 | 317 | 315 | 355 | 354 | 348 | 382 |

Example 3

The CVD experiment described in Example 2 was repeated to provide tungsten followed by tungsten/tungsten carbide coatings. The specimens and reaction conditions were similar to those of Example 2 (see Table 2). Immediately after coating the specimens for 90 minutes with tungsten/tungsten carbide, the flow of $WF_6$ and DME was discontinued, but the flow of hydrogen and argon was maintained. Additionally, the power to the induction heater was kept on to post heat treat the specimens in-situ at 460° C. for 60 minutes. After 60 minutes of post heat treatment, the power to the induction heater was turned-off, and the specimens were cooled. A pressure of 40 Torr was maintained during the post heat treatment and cool-down.

The AM-350 and Ti/6Al/4V specimens were coated with ~11.5 μm tungsten followed by 13.2 μm tungsten/tungsten carbide, as shown in Table 2. The tungsten interlayer had the well known columnar growth microstructure; whereas, the tungsten/tungsten carbide top coat had a fine-layered structure, similar to that noted in Example 2. Surprisingly, the 60 minute post heat treatment eliminated the microstructural nonuniformity in the top one-fourth of the tungsten/tungsten carbide coating, which is apparent in FIGS. 2A and 2B. The tungsten/tungsten carbide coating had a surface finish of ~20 μ inch. Furthermore, it was free of cracks. This indicates that in-situ post heat treatment of the coating at the deposition temperature neither degrades the surface finish of the coating nor causes cracks in the coating. X-ray diffraction analysis revealed that the tungsten/tungsten carbide top coat consisted of a mixture of W and $W_2C$ phases (see Table 3), indicating no changes in the coating composition with post heat treatment. Furthermore, the coating hardness data summarized in Table 3 showed no measurable change in the coating hardness with post heat treatment. The erosion rate of the tungsten/tungsten carbide top coat on AM-350 stainless steel and Ti/6Al/4V was 317 and 315 seconds/mil, respectively (see Table 3). The erosion test data, therefore, showed an increase in erosion resistance of approximately 14 and 12% on AM-350 and Ti/6Al/4V specimens, respectively (see Table 4). This 12 to 14% increase in the erosion resistance was more than 4% variation observed in the erosion test procedure, as described in the Example 2.

This Example, therefore, shows that in-situ post heat treatment of the hard coating at the deposition temperature not only improves the coating microstructure but also the erosion resistance without degrading the coating hardness.

Example 4

The CVD experiment described in Example 2 was repeated to provide tungsten followed by tungsten/tungsten carbide coatings. The specimens and reaction conditions were similar to those of Example 2 (see Table 2). Immediately after coating the specimens for 90 minutes with tungsten/tungsten carbide, the flow of WF and DME was discontinued, but the flow of hydrogen and argon was maintained. Additionally, the power to the induction heater was kept on to post heat treat the specimens in-situ at 460° C. for 120 minutes. After 120 minutes of post heat treatment, the power to the induction heater was turned-off, and the specimens were cooled. A pressure of 40 Torr was maintained during the post heat treatment and cool-down.

The AM-350 and Ti/6Al/4V specimens were coated with ~10.54 μm tungsten followed by 13.3 μm tungsten/tungsten carbide, as shown in Table 2. The tungsten interlayer had the well known columnar growth microstructure; whereas, the tungsten/tungsten carbide top coat had a fine-layered structure, as shown in FIGS. 3A and 3B. As noted in Example 3, the 120 minute post heat treatment eliminated the microstructural nonuniformity that was present without heat treatment (compare FIGS. 3A and 3B with FIGS. 1A and 1B). The tungsten/tungsten carbide coating, once again, had a surface finish of ~20 μ inch. Furthermore, it was free of cracks. The in-situ post heat treatment at the deposition temperature did not degrade the surface finish or cause cracking of the coating. X-ray diffraction analysis revealed that the top coat consisted of a mixture of W and $W_2C$ phases (see Table 3), indicating no change in the coating composition with the post heat treatment. The hardness of the top coat was also unaffected by the post heat treatment (see Table 3). The erosion resistance of the top coat on AM-350 stainless steel and Ti/6Al/4V was 355 and 354 seconds/mil, respectively (see Table 3). This data indicates an increase in erosion resistance of approximately 27 and 26% for AM-350 and Ti/6Al/4V specimens, respectively (see Table 4).

tion temperature for an extended period of time does not cause cracks in the coating. X-ray diffraction analysis revealed that the top coat consisted of a mixture of W and $W_2C$ phases (see Table 3), indicating no change in the coating composition with the post heat treatment. The hardness of the top coat was marginally lower than that noted without heat treatment (see Table 3), but the values were equivalent and within the limits of the standard deviation of the measurement. The erosion resistance of the top coat on AM-350 stainless steel and Ti/6Al/4V was 348 and 382 seconds/mil, respectively (see Table 3). The erosion data, therefore, showed an increase in erosion resistance of approximately 25 and 35% for AM-350 and Ti/6Al/4V specimens, respectively (see Table 4).

This Example, once again, shows that increasing the in-situ post heat treatment time of the hard coating at the deposition temperature improves coating microstructure and increases erosion resistance without degrading coating hardness.

Example 6

AM-350 and Ti/6Al/4V specimens coated with tungsten followed by tungsten/tungsten carbide in Example 2 were post heat treated externally in a controlled atmosphere furnace. The furnace was evacuated and purged with argon several times to remove traces of air before heat treatment. The coated specimens were heated to

TABLE 4

| Example No. | In-Situ Post Heat Treatment Time, Min. | Calculated Erosion Rate, secs/mil | | Improvement in Erosion Rate, % | |
|---|---|---|---|---|---|
| | | AM-350 | Ti/6Al/4V | AM-350 | Ti/6Al/4V |
| 2 | 0 | 279 | 282 | — | — |
| 3 | 60 | 317 | 315 | 13.6 | 11.7 |
| 4 | 120 | 355 | 354 | 27.2 | 25.5 |
| 5 | 480 | 348 | 382 | 24.7 | 35.5 |

This Example, therefore, shows that increasing the in-situ post heat treatment time of the hard coating at the deposition temperature improves the coating microstructure and increases the erosion resistance without degrading coating hardness.

Example 5

The CVD experiment described in Example 2 was repeated to provide tungsten followed by tungsten/tungsten carbide coatings. The specimens and reaction conditions were similar to those of Example 2 (see Table 2). Immediately after coating the specimens for 90 minutes with tungsten/tungsten carbide, the flow of $WF_6$ and DME was discontinued, but the flow of hydrogen and argon was maintained. Additionally, the power to the induction heater was kept on to post heat treat the specimens in-situ at 460° C. for 480 minutes. After 480 minutes of post heat treatment, the power to the induction heater was turned off, and the specimens were cooled. A total pressure of 40 Torr was maintained during the post heat treatment and cool-down.

The AM-350 and Ti/6Al/4V specimens were coated with ~8 μm tungsten followed by 10.5 μm tungsten/tungsten carbide coatings, as shown in Table 2. The tungsten interlayer had the well known columnar growth microstructure; whereas, the tungsten/tungsten carbide top coat had a fine-layered structure. Once again, the top coat exhibited a uniform etch behavior. The tungsten/tungsten carbide coating was crack free and had a surface finish of ~20 μ inch. This information suggests that in-situ post heat treatment at the deposi- 475° C., which was 15° C. higher than the deposition temperature, under flowing 5% hydrogen/95% argon mixture. A total pressure slightly above one atmosphere was maintained in the furnace. The temperature was maintained for 60 minutes to post heat treat the specimens. After 60 minutes the specimens were cooled.

Compared to coatings with no heat treatment, coatings post heat treated for only 60 minutes in the controlled atmosphere furnace showed a dramatic reduction in the non-uniform microstructure of the tungsten/tungsten carbide layer which is revealed by etching, as shown in FIGS. 4A and 4B. The coating was absolutely crack-free, indicating that the post heat treatment at 475° C., which was 15° C. higher than the deposition temperature, did not generate cracks in the coating. The surface finish of the coating was ~20 μ inch. X-ray diffraction analysis of the heat treated coating showed no changes in the coating composition. Additionally, the hardness of the tungsten/tungsten carbide top coat did not change with the post heat treatment. The erosion resistance of the coatings on AM-350 and Ti/6Al/4V, however, improved by more than 6% (see Table 5). The erosion resistance of the coatings after 60 minutes of external heat treatment was surprisingly lower than that noted after 60 minutes of in-situ heat treatment (compare Examples 3 and 6). The differences in the improvement in the erosion insistence by in-situ and external heat treatments could be due to the use of vacuum during in-situ heat treatment as opposed to using atmospheric pressure in the external heat treatment.

This example, therefore, shows that the post heat treatment of the hard coating using temperature slightly higher than the deposition temperature not only improves coating microstructure but also erosion resistance without degrading coating hardness.

Example 7

AM-350 and Ti/6Al/4V specimens coated in Example 2 were again post heat treated in a controlled atmosphere furnace. The heat treatment procedure and conditions were similar to those used in Example 6 with the exception of maintaining the temperature for 1,440 minutes instead of 60 minutes.

Etched cross sections showed that the coating was microstructurally uniform after 1,440 minutes of heat treatment (see FIGS. 5A and 5B). No changes in coating composition and hardness, however, were noted with the post heat treatment. The erosion resistance of the coatings, on the other hand, improved by more than 13% (see Table 5). The erosion resistance of the coating on AM-350 stainless steel after 1,440 minutes of external heat treatment was very close to the value noted after 60 minutes of in-situ heat treatment. This data indicated that longer external heat treatment times were needed to match the improvements in erosion resistance noted with in-situ heat treatment. These differences, once again, could be due to the use of atmospheric pressure in the external heat treatment as opposed to using vacuum during in-situ heat treatment. The coating was crack-free, which indicated that the prolonged post heat treatment at 475° C., which was slightly higher than the deposition temperature, did not generate cracks in the coating. The surface finish of the coating was ~20 μ inch.

treatment at 475° C. did not generate any cracks in the coating.

These examples, therefore, show that the external heat treatment at temperature slightly higher than the deposition temperature does not have any noticeable effects on the hard coatings, which are previously post heat treated in-situ for 60 minutes.

Example 10

AM-350 and Ti/6Al/4V specimens coated with tungsten followed by tungsten/tungsten carbide in Example 4 were post heat treated for 1,440 minutes in a controlled atmosphere furnace similar to that described in Example 9. The post heat treatment procedure and conditions were the same as described in Example 6 with the exception of heat treatment time. Before heat treating these specimens for 1,440 minutes in the external furnace, these specimens were heat treated for 120 minutes in-situ. Furthermore, these specimens had dense tungsten/tungsten carbide top coats prior to external heat treatment.

External heat treatment of these samples for 1,440 minutes, once again, did not cause any further change in the microstructure of the tungsten/tungsten carbide top coat. Furthermore, no significant changes in coating composition, hardness or erosion resistance were observed due to external heat treatment. Finally, the external heat treatment at 475° C. did not generate any cracks in the coating.

This example, therefore, shows that the external heat treatment at temperatures slightly higher than the deposition temperature does not have any noticeable effects on the hard coatings, which are previously post heat treated in-situ for 120 minutes.

DISCUSSION

TABLE 5

| Example No. | In-Situ Heat Treatment Time, Min. | External Heat Treatment Time, Min. | Calculated Erosion Rate, secs/mil | | Improvement in Erosion Rate, % | |
|---|---|---|---|---|---|---|
| | | | AM-350 | Ti/6Al/4V | AM-350 | Ti/6Al/4V |
| 2 | 0 | 0 | 279 | 282 | — | — |
| 6 | 0 | 60 | 298 | 304 | 6.8 | 7.8 |
| 7 | 0 | 1,440 | 315 | 329 | 12.9 | 16.7 |
| 3 | 60 | 0 | 317 | 315 | — | — |
| 8 | 60 | 60 | 313 | 314 | No Change | No Change |
| 9 | 60 | 1,440 | 312 | 312 | No Change | No Change |

Examples 8 and 9

AM-350 and Ti/6Al/4V specimens coated with tungsten followed by tungsten/tungsten carbide from Example 3 were post heat treated for 60 and 1,440 minutes in a controlled atmosphere furnace similar to that described in Example 6. The heat treatment procedure and conditions were the same as described in Example 6 with the exception of heat treatment time. Before heat treating these coated specimens for 60 and 1,440 minutes in the external furnace, these specimens were already heat treated for 60 minutes in-situ. Furthermore, these specimens had dense tungsten/tungsten carbide top coat prior to external heat treatment.

External heat treatment of these samples for either 60 or 1,440 minutes did not cause any further change in the microstructure of the tungsten/tungsten carbide top coat. No significant changes in coating composition, hardness and erosion resistance were observed due to external heat treatment. Furthermore, the external heat

Examples 1–10

The microstructural uniformity and, consequently, the erosive and abrasive wear resistance of the tungsten/tungsten carbide coating is measurably improved by heat treating the coated samples at approximately the deposition temperature. The post-deposition heat treatment seems to primarily affect the microstructural characteristics, as revealed by etching, of the outermost layers of the coating. This observation is consistent with the observed affect of heat treatment, because the outermost layers of the coating have been maintained at the deposition temperature for the shortest period of time. It is likely, therefore, that the post-deposition heat treatment primarily affects the erosion and abrasive wear resistance of the outermost layers of the tungsten/tungsten carbide coating.

Without wishing to be bound by theory, a number of mechanisms could be responsible for the effect of heat treatment on the structure and properties of the coating. (1) Heat treatment could cause densification of the coating by a sintering mechanism. (2) Heat treatment may be necessary in order to get complete removal of all of the volatile byproducts of the coating reaction from the coating layer. (3) Post deposition heat treatment may be necessary to cause crystallization of the equilibrium phases. Regardless of the operative mechanism, a post-deposition heat treatment is required to yield a coating with optimal erosion resistance.

in this example was slightly different to that observed in Examples 2 to 5, probably because of the differences in the tungsten/tungsten carbide deposition rate. The thickness, the microhardness, and the composition (W+W$_2$C) of the tungsten/tungsten carbide coating layer were essentially identical for the AM-350 and the Ti/6Al/4V.

TABLE 6

The Effect of Post-Deposition Heat-Treatment Temperature on the Properties of Tungsten/Tungsten Carbide

| Example No. | Experiment No. | Coating Thickness, μm | External Heat Treatment Temperature, °C. | External Heat Treatment Time, hours | Coating Hardness, Kg/mm$^2$ | Breakthrough Time, sec | Erosion Rate, sec/mil |
|---|---|---|---|---|---|---|---|
| AM-350 Stainless Steel ||||||||
| Example 11 | 138  | 10.0 | None | None | 2250 ± 100 | 115 | 292 |
| Example 12 | 138A | 10.0 | 450  | 12   | 2300       | 118 | 299 |
| Example 13 | 138B | 10.0 | 500  | 12   | 2325       | 123 | 312 |
| Example 14 | 138C | 10.0 | 550  | 12   | 2350       | 130 | 330 |
| Example 15 | 138D | 10.0 | 600  | 12   | 2350       | 152 | 386 |
| Ti/6Al/4V ||||||||
| Example 11 | 133  | 10.0 | None | None | 2200 ± 100 | 116 | 294 |
| Example 12 | 133A | 10.5 | 450  | 12   | 2175       | 127 | 307 |
| Example 13 | 133B | 10.8 | 500  | 12   | 2175       | 143 | 336 |
| Example 14 | 133C | 10.0 | 550  | 12   | 2375       | 158 | 401 |
| Example 15 | 133D | 10.0 | 600  | 12   | 2450       | 231 | 586 |

THE EFFECT OF POST HEAT TREATMENT TEMPERATURE

Example 11

After establishing that a post-deposition heat treatment is necessary to optimize the erosion and abrasion wear resistance of the tungsten/tungsten carbide coating, a set of experiments was conducted to evaluate the effect of a post-deposition heat treatment at temperatures greater than the deposition temperature (460° C). Samples of AM-350 and Ti/6Al/4V were coated with tungsten followed by tungsten/tungsten carbide; although the AM-350 and Ti/6Al/4V were coated in separate runs, the deposition conditions for these two runs were essentially identical. Tungsten deposition was carried out for approximately 20 minutes at a temperature of 460° C. and a pressure of 40 Torr using 250 cc/min WF$_6$, 2500 cc/min H$_2$, and 6000 cc/min Ar. Tungsten/tungsten carbide deposition was carried out for approximately 65 minutes at a temperature of 460° C. and a pressure of 40 Torr using 300 cc/min WF$_6$, 3000 cc/min H$_2$, 1800 cc/min Ar, and 90 cc/min DME (dimethylether). Although the WF$_6$/DME ratio used in depositing tungsten/tungsten carbide coating in this example was same as that used in Examples 2 to 5, the flow rate of argon and reaction time were lower in this example than Examples 2 to 5. The lower argon flow rate increased the partial pressure of hydrogen, WF$_6$ and DME during the tungsten/tungsten carbide coating step, resulting in the higher coating rate. Immediately after coating, the flow of WF$_6$ and DME was discontinued, but the flow of hydrogen and argon was continued. The samples were then heat treated for 60 minutes using the H$_2$/Ar atmosphere at 460° C. and 40 Torr.

Both sets of samples were coated with a crack-free tungsten/tungsten carbide top coat approximately 10 μm thick. The tungsten/tungsten carbide coating was microstructurally uniform. The microhardness and the breakthrough time in an erosion test are given for these coatings in Table 6; these values establish the baseline data for this set of experiments. The erosion rate noted

Example 12

An AM-350 and a Ti/6Al/4V specimen from the deposition runs described in Example 11 were heat treated externally in a controlled atmosphere furnace at 450° C., which was slightly lower than the deposition temperature, for 12 hours using a 95% Ar/5% H$_2$ gas mixture. A total pressure slightly above one atmosphere was maintained in the furnace. The microhardness and the breakthrough time in an erosion test for these heat treated samples is given in Table 6. The microhardness values for these samples are approximately the same as for the sample of Example 11. The erosion resistance, on the other hand, improved marginally, as shown in Table 6. Therefore, this example shows that the external post heat treatment at 450° C., which is slightly lower than the deposition temperature, marginally improves the performance of the coating, which has previously been heat treated in-situ for 60 minutes. The uniform, fine-layered microstructure was essentially identical to that of the samples of Example 11. In addition the tungsten/tungsten carbide coating remained crack free following the heat treatment.

Example 13

An AM-350 and a Ti/6Al/4V specimen from the deposition runs described in Example 11 were heat treated in a controlled atmosphere furnace at 500° C., which was considerably higher than the deposition temperature, for 12 hours using a 95% Ar/5% H$_2$ gas mixture. A total pressure slightly above one atmosphere was maintained in the furnace. The microhardness and the breakthrough time in an erosion test for these heat treated samples is given in Table 6. The erosion rates are higher for these samples as compared to the samples of Example 11; however, the microhardness values remain unchanged. The uniform, fine-layered microstructure of these samples was essentially identical to that exhibited by the samples of Example 11 (see FIGS. 6A and 6B).

However, cracks are formed in the tungsten/tungsten carbide coating due to this heat treatment, as shown in FIGS. 6C and 6D. The effect that these cracks have on the erosion resistance of the coating is to cause the coating to erode rapidly in the region of the cracks, so that the substrate is quickly exposed to the erosive medium (the breakthrough times given in Table 6 were determined in the areas of the coating that were free of cracks). The cracks, which may be due to the mismatch in the coefficient of thermal expansion between the coating and the substrate, therefor degrade the ability of the tungsten/tungsten carbide coating to act as a protective coating. Therefore, in order to prevent cracks in the coating it is undesirable to post heat treat the coating at temperatures substantially above the deposition temperature.

Example 14

An AM-350 and a Ti/6Al/4V specimen from the deposition runs described in Example 11 were heat treated in a controlled atmosphere furnace at 550° C., which was once again substantially higher than the deposition temperature, for 12 hours using a 95% Ar/5% $H_2$ gas mixture. A total pressure slightly above one atmosphere was maintained in the furnace. The microhardness and the breakthrough time in an erosion test for these heat treated samples are given in Table 6. For the AM-350 sample, the microhardness and erosion resistance values are higher than that of the baseline coating. However, the microhardness and the erosion rate in the crack-free areas on the Ti/6Al/4V sample have significantly higher values than the sample of Example 11. In addition, cracks were formed in the coatings on both substrates due to the heat treatment at 550° C.

The uniform, fine-layered microstructure of the coated AM-350 and Ti/6Al/4V samples was not affected by the 550° C. heat treatment, as shown in FIGS. 7A and 7B. However, a reaction layer was observed to form between the electroless nickel layer and the Ti/6Al/4V substrate. (see FIG. 7B). This reaction layer was an intermetallic titanium-nickel compound. Since cracks reduce the ability of the tungsten/tungsten carbide coating to protect the substrate from erosion. It is therefore undesirable to heat treat the coating at temperatures substantially above the deposition temperature.

Example 15

An AM-350 and a Ti/6Al/4V coupon from the deposition runs described in Example 11 were heat treated in a controlled atmosphere furnace at 600° C., which was considerably higher than the deposition temperature, for 12 hours using a 95% Ar/5% $H_2$ gas mixture. A total pressure slightly above one atmosphere was maintained in the furnace. The microhardness and the breakthrough time of the coating in an erosion test for these heat treated samples are given in Table 6. For the AM-350, the microhardness and the erosion rate in the crack-free areas are both higher than that of the baseline coating. For the Ti/6Al/4V, the microhardness and the erosion rate in the crack-free areas are significantly higher than the baseline coating and even the coating heat treated at 550° C. Once again, wide cracks are formed in the coating due to heat treatment at this temperature, as shown in FIGS. 8A and 8B.

The microstructure of the hard coating in this example was unaffected by the heat treatment, see FIGS. 8C and 8D. The intermetallic titanium-nickel compound reaction layer was substantially thicker due to the increase in the post heat treatment temperature. (see FIGS. 8D). The intermetallic titanium-nickel compound, which is formed during post-deposition heat treatments at 550° and 600° C., is a brittle phase and, thus, is undesirable. The effect this brittle interlayer has on the adhesion of the nickel and hard coating on the Ti/6Al/4V substrate was that a crack is produced in the region of the titanium-nickel compound when the tungsten/tungsten carbide coating is initially penetrated during the erosion test. This crack tends to propagate along the titanium-nickel compound layer which undermines the coating and causes coating spallation, as shown in FIG. 9. Although the initial breakthrough time in the crack-free areas is substantially higher in the Ti/6Al/4V samples heat treated at 550° and 600° C., the intermetallic layer will cause spallation and catastrophic failure of the coating once the coating is penetrated. Cracks in the coating cause rapid local erosion, which results in quick exposure of the titanium-nickel intermetallic layer to the erosive medium. The quick exposure coupled with the propagation of cracks along the intemetallic compound layer will cause rapid coating spallation and catastrophic failure.

This example, once again, shows that it is undesirable to post heat treat the coating at temperatures substantially above the deposition temperature.

Example 16

Another set of experiments was conducted to evaluate the effect of a post-deposition heat treatment at temperature slightly greater than the deposition temperature. Samples of AM-350 and Ti/6Al/4V were coated with tungsten followed by tungsten/tungsten carbide in a run. Tungsten deposition was carried out for approximately 35 minutes at a temperature of 455° C. and a pressure of 40 Torr using 150 cc/min. $WF_6$, 1500 cc/min. $H_2$, and 8000 cc/min. Ar. Tungsten/tungsten carbide deposition was carried out for approximately 85 minutes at a temperature of 455° C. and a pressure of 40 Torr using 300 cc/min. $WF_6$, 3000 cc/min. $H_2$, 2400 cc/min. Ar, and 95 cc/min. DME (dimethylether). Immediately after coating, the flow of $WF_6$, $H_2$ and DME was discontinued, but the flow of argon was continued. The power to the induction heater was also turned-off and the specimens were cooled in flowing argon gas. The coated samples were, therefore, not post heat treated in this example. A total pressure of 40 Torr was maintained during cooldown.

The AM-350 and Ti/6Al/4V specimens were coated with ~9 μm thick tungsten followed by ~13.0 μm tungsten/tungsten carbide, as shown in Table 7. The tungsten layer had the well known columnar growth microstructure; whereas, the tungsten/tungsten carbide top coat had a fine-layered structure similar to the one shown in FIG. 1A. The top one fourth of the tungsten/tungsten carbide coating both on AM-350 stainless steel and Ti/6Al/4V showed a non-uniform microstructure similar to the one shown in FIG. 1A. The coating was free of cracks, and consisted of a mixture of W and $W_2C$ phases. The hardness of tungsten/tungsten carbide top coat was approximately 2200 Vickers, as shown in Table 7.

This example showed that a hard and a crack free tungsten/tungsten carbide coating could be deposited at 455° C., which was slightly lower than the temperature used in the previous examples. Because of the differences in the deposition temperature and DME flow rate, the tungsten/tungsten carbide coating rate obtained in this example was different to the one noted in the previous examples. However, the tungsten/tungsten carbide top coat still showed a non-uniform microstructure similar to the one noted in Example 2. The erosion resistance of the coating shown in Table 7 was also different compared to Example 2. The differences in the hardness and the erosion resistance values between this example and Example 2 could be due to differences in the deposition temperature and the partial pressure of DME used in these examples.

TABLE 7

The Effect of Post-Deposition Heat-Treatment Time on the Properties of Tungsten/Tungsten Carbide

| Example No. | Experiment No. | Coating Thickness, μm | External Vacuum Heat Treatment Time, Hours | Coating Hardness, Kg/mm$^2$ | Erosion Rate, sec/mil | Improvement in Erosion Rate, % |
|---|---|---|---|---|---|---|
| AM-350 Stainless Steel | | | | | | |
| Example 16 | 399 | 13.4 | None | 2244 | 250 | — |
| Example 17 | 399A | 13.4 | 3 | 2261 | 275 | 10.0 |
| Ti/6Al/4V | | | | | | |
| Example 16 | 399 | 12.4 | None | 2191 | 246 | — |
| Example 17 | 399A | 12.4 | 3 | 2239 | 286 | 16.3 |

Example 17

An AM-350 and a Ti/Al/4V specimen from the deposition run described in Example 16 were heat treated externally in a vacuum furnace at 475° C., which was 20° C. higher than the deposition temperature, under flowing argon gas. A total pressure of approximately 40 Torr was maintained in the furnace. The temperature was maintained for 3 hours to post heat treat the specimens. After 3 hours the specimens were cooled.

Compared to coatings with no heat treatment (Example 16), coatings post heat treated externally in a vacuum furnace for 3 hours showed the absence of non-uniformity in the microstructure. The coating was absolutely crack-free, indicating that the post heat treatment at 475° C., which was 20° C. higher than the deposition temperature, under vacuum did not generate cracks in the coating. X-ray diffraction analysis of the heat treated coatings showed no changes in the coating composition. Additionally, the hardness of the tungsten/tungsten carbide top coat did not change significantly with the post heat treatment. The erosion resistance of the coating on AM-350 and Ti/6Al/4V, however, improved by more than 10% by post heat treatment (see Table 7).

This example, therefore, shows that the post heat treatment of the hard coating under vacuum using temperature slightly higher than the deposition temperature not only improves coating microstructure but also erosion resistance without degrading coating hardness.

DISCUSSION

Examples 11–17

The maximum temperature at which metal alloys can be coated and/or heat treated will be dictated largely by the characteristics of the metal and not by the characteristics of the coating. In the case of AM-350 and Ti/6Al/4V, a measurable loss in strength resulted from extended heat treatments at temperatures significantly above 500° C. This result is shown in Table 8, which gives the yield strengths of uncoated samples of AM-350 and Ti/6Al/4V that had been heat treated for 12 hours at 450°, 500°, 550°, and 600° C. According to Table 8, AM-350 exhibited a larger reduction in strength than Ti/6Al/4V. The yield strengths were determined on flat specimens in bending using a 0.2% offset strain criteria. Since the strain is not homogeneous in bending, these values of the yield strength are larger than those typically measured in tension, however, these values give a good indication of the change in the yield strength with the deposition and/or heat treatment temperature. Consequently, the deposition as well as heat treatment temperatures need to be limited to a maximum value of about 500° C. to avoid any degradation in the strength of the alloys used in the examples presented herein. The maximum deposition and heat treatment temperatures of the other materials can be determined using the information on temperature and mechanical properties of these materials.

Additionally, it is important that the coating is substantially free of cracks in order for the coating to provide uniform erosion and abrasion wear protection over the entire surface of a part. This conclusion results from the observation that cracked regions of the coating tend to erode rapidly. The coating remained substantially free of cracks only when the heat treatment temperature was held below 500° C. for the AM-350 stainless steel and Ti/6Al/4V. This temperature limit maybe different for other ferrous and nonferrous metals and alloys. It is also possible to produce a substantially crack free coating only if the post heat treatment temperature does not substantially exceed the deposition temperature. Finally, post-deposition heat treatments at temperatures substantially higher than the deposition temperature, in this case 550° and 600° C., can result in the formation of brittle inter-metallic layers which are undesirable.

TABLE 8

| Substrate | Heat Treatment Temperature, °C. | Heat Treatment Time, hours | Yield Strength in 4-pt Flexure, ksi |
|---|---|---|---|
| AM-350 | 450 | 12 | 174 |
| AM-350 | 500 | 12 | 176 |
| AM-350 | 550 | 12 | 150 |
| AM-350 | 600 | 12 | 141 |
| Ti/6Al/4V | 450 | 12 | 183 |
| Ti/6Al/4V | 500 | 12 | 189 |
| Ti/6Al/4V | 550 | 12 | 183 |
| Ti/6Al/4V | 600 | 12 | 171 |

CONCLUSIONS

A post-deposition heat treatment will substantially improve the performance of tungsten/tungsten carbide coatings in erosive and abrasive wear environments. Optimal erosion and abrasion wear resistance and microstructural uniformity can be achieved by heat treating at approximately the deposition temperature for an extended period of time. The heat treatment can be carried out either immediately after the deposition or at a later time. In general, a heat treatment at the deposition temperature is just as effective at optimizing the properties of the coating as heat treatments at somewhat higher temperatures. However, heat treating at the deposition temperature avoids the problems associated with the higher temperature heat treatments. These problems include degradation of the mechanical properties of the metal substrates, formation of cracks in the protective coating, and formation of brittle intermetallic layers. Consequently, it is preferable to heat treat the coated samples for a period of time (at least one hour) at a temperature which does not substantially exceed the deposition temperature. The fact that this heat treatment is sufficient for optimizing the properties of the coating is a new and important result.

Contrary to the prior art, the coating system presented in the present invention does neither undergo a phase change nor experience a reduction in the hardness upon heat treatment in the range 450° to 600° C. The post heat treatment eliminates microstructural non-uniformities in the coating, thereby increasing its erosion and abrasive wear resistance. The post heat treatment temperature, however, needs to be carefully selected and controlled to obtain the desired improvement in the coating performance. Contrary to the prior art, the heat treatment temperature needs to be maintained below 500° C. or at the deposition temperature for AM-350 stainless steel and Ti/6Al/4V. The use of heat treatment temperature substantially above 500° C. and/or the deposition temperature causes cracks in the coating, resulting in poor overall performance.

What is claimed is:

1. A method for heat treating a coated substrate wherein an intermediate layer of tungsten is first deposited on the substrate and then an outer coating is deposited on the tungsten intermediate layer and wherein the outer coating having a substantially layered microstructure substantially free of cracks is comprised of a chemical vapor deposited mixture of tungsten and tungsten carbide wherein the tungsten carbide phase consists of $W_2C$ or $W_3C$ or a mixture of $W_2C$ and $W_3C$, said method comprising heating said coated substrate to a temperature in the range from about 300° C. to about 500° C. in a non-reactive atmosphere for a period of time to confer substantially higher erosion and abrasion wear resistance to the outer coating than the coating in its heated treated condition but which does not result in substantial degradation of the mechanical properties of the substrate or in formation of undesirable inter-metallic layers.

2. A method according to claim 1 wherein the period of time of heat treating is at least one hour.

3. A method according to claim 1 wherein the heat treating atmosphere is maintained at or below atmospheric pressure.

4. A method according to claim 1 wherein said heat treating atmosphere is hydrogen, argon, helium, nitrogen or a mixture of two or more said gases.

5. A method according to claim 1 wherein an intermediate layer of nickel is deposited on the substrate prior to deposition of said tungsten.

6. A method according to claim 1 wherein said substrate is a ferrous or non-ferrous alloy.

7. A method for conferring substantial erosion and abrasion wear resistant properties on a substrate, comprising, product on the substrate an intermediate layer of tungsten deposited on the substrate and then a chemical vapor deposited outer coating having a substantial layered microstructure substantially free of cracks of a mixture of tungsten and tungsten carbide wherein the tungsten carbide phase consists of $W_2C$ or $W_3C$ or a mixture of $W_2C$ and $W_3C$, and heating said coated substrate to a temperature in the range from about 300° C. to about 500° C. in a non-reactive atmosphere for a period of time to confer substantially higher erosion and abrasion wear resistance to the outer coating than the coating in its unheated treated condition but which does not result in substantial degradation of the mechanical properties of the substrate or in formation of undesirable inter-metallic layers.

8. A method according to claim 7 wherein the period of time of heat treating is at least one hour.

9. A method according to claim 7 wherein the heat treating atmosphere is maintained at or below atmospheric pressure.

10. A method according to claim 7 wherein the heat treating atmosphere is hydrogen, argon, helium, nitrogen or a mixture of two or more said gases.

11. A method according to claim 7 wherein an intermediate layer of nickel is deposited on the substrate prior to deposition of said tungsten.

12. A method according to claim 7 wherein said substate is a ferrous or non-ferrous alloy.

13. A method according to claim 7 wherein said substrate is a stainless steel.

14. A method according to claim 13 wherein said substrate is heat treated to a temperature of about 500° C.

15. A method according to claim 7 wherein said substrate is a titanium alloy.

16. A method according to claim 15 wherein said substrate is heat treated to a temperature of less than about 500° C.

* * * * *

UNITED STATES PATENT AND TRADEMARK OFFICE
CERTIFICATE OF CORRECTION

PATENT NO. : 5,262,202

DATED : November 16, 1993

INVENTOR(S) : Garg, et al.

It is certified that error appears in the above-identified patent and that said Letters Patent is hereby corrected as shown below:

In the claims:

Column 21, line 51, delete "heated", insert -- unheated --.

Column 22, line 16, delete "product", insert -- producing --.

Signed and Sealed this

Fifth Day of July, 1994

Attest:

BRUCE LEHMAN

Attesting Officer   Commissioner of Patents and Trademarks